United States Patent
Bertagna et al.

(10) Patent No.: US 8,902,060 B2
(45) Date of Patent: *Dec. 2, 2014

(54) FOOTWEAR WITH EMBEDDED TRACKING DEVICE AND METHOD OF MANUFACTURE

(71) Applicant: Global Trek Xploration Corp., Los Angeles, CA (US)

(72) Inventors: Patrick E. Bertagna, Los Angeles, CA (US); Ralph H. Davis, Laguna Beach, CA (US); Christopher M. Walsh, Pacific Palisades, CA (US); Gregg S. Schilawski, De Pere, WI (US); James H. Cohen, Glendale, CA (US); Dongeun Lim, Haeundae (KR); Gregory J. Provenzano, Carlsbad, CA (US); Alexander Gildea Stricker, San Rafael, CA (US)

(73) Assignee: Global Trek Xploration Corp., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,005

(22) Filed: Oct. 16, 2012

(65) Prior Publication Data

US 2013/0043994 A1    Feb. 21, 2013

Related U.S. Application Data

(60) Division of application No. 13/080,309, filed on Apr. 5, 2011, now Pat. No. 8,289,156, which is a division of (Continued)

(51) Int. Cl.
*G08B 1/08* (2006.01)
*A43B 13/00* (2006.01)
(Continued)

(52) U.S. Cl.
CPC . *A43B 5/00* (2013.01); *A43B 13/00* (2013.01); *A43B 7/00* (2013.01); *A43B 3/0005* (2013.01)

USPC .............. 340/539.13; 340/573.1; 340/539.11; 36/75 R; 12/142 T

(58) Field of Classification Search
USPC ................. 340/573.1, 539.1, 539.11, 539.13, 340/539.15, 5.61, 5.64, 693.5; 455/456.1, 455/457; 701/213; 342/357.01, 357.06, 342/357.07, 357.09, 357.12, 457; 36/75 R; 12/142 T See application file for complete search history.

(56) References Cited

U.S. PATENT DOCUMENTS 5,748,087 A * 5/1998 Ingargiola et al. ......... 340/573.7
6,867,697 B2 * 3/2005 Nanayakkara et al. .... 340/573.1

(Continued)

OTHER PUBLICATIONS

CA Application No. 2,641,469, Office Action dated Jan. 23, 2013.

(Continued)

*Primary Examiner* — Anh V La
(74) *Attorney, Agent, or Firm* — Larry E. Henneman, Jr.; Gregory P. Gibson; Henneman & Associates, PLC

(57) ABSTRACT

Footwear with an embedded tracking device includes a sole and an upper. The tracking device is disposed in a cavity formed in the top surface of the sole. A wireless communication antenna and/or a location signal antenna is disposed on the upper. The antenna(s) is/are connected to the tracking device via a flexible circuit substrate. In a particular embodiment, the location signal antenna is a passive, directional GPS antenna supported in an upwardly facing position in the heel portion of the upper. A method for manufacturing footwear with an embedded tracking device is also disclosed. The method includes providing a footwear upper, incorporating an antenna in the footwear upper, providing a footwear sole, fixing the footwear upper to the footwear sole, incorporating a tracking device into the footwear sole, and connecting the tracking device to the antenna.

9 Claims, 8 Drawing Sheets

Related U.S. Application Data application No. 12/319,307, filed on Jan. 6, 2009, now Pat. No. 7,920,059, which is a continuation of application No. 11/348,292, filed on Feb. 6, 2006, now Pat. No. 7,474,206.

(51) Int. Cl.
*A43B 7/00* (2006.01)
*A43B 5/00* (2006.01)
*A43B 3/00* (2006.01)

(56) References Cited

U.S. PATENT DOCUMENTS

| | | | |
|---|---|---|---|
| 7,474,206 B2 * | 1/2009 | Bertagna et al. | 340/539.13 |
| 8,289,156 B2 * | 10/2012 | Bertagna et al. | 340/539.13 |
| 2006/0103538 A1 * | 5/2006 | Daniel | 340/574 |
| 2012/0081223 A1 | 4/2012 | Kaminski et al. | |

OTHER PUBLICATIONS

MX Application No. MX/A/2008/010160, Office Action dated Nov. 29, 2012 (English translation).
U.S. Appl. No. 13/323,328, Office Action dated Apr. 2, 2012.
U.S. Appl. No. 13/323,328, Interview Summary dated Oct. 5, 2012.
U.S. Appl. No. 13/323,328, Notice of Allowance dated Dec. 14, 2012.

* cited by examiner

FOOTWEAR WITH EMBEDDED TRACKING DEVICE AND METHOD OF MANUFACTURE

RELATED APPLICATIONS

This application is a divisional of copending U.S. patent application Ser. No. 13/080,309 filed Apr. 5, 2011 by the same inventors (now U.S. Pat. No. 8,289,156), which is a divisional of U.S. patent application Ser. No. 12/319,307 filed Jan. 6, 2009 by the same inventors (now U.S. Pat. No. 7,920,059), which is a continuation of U.S. patent application Ser. No. 11/348,292, filed Feb. 6, 2006 by the same inventors (now U.S. Pat. No. 7,474,206), all of which are incorporated herein by reference in their entireties.

BACKGROUND OF THE INVENTION

1. Field of the Invention

This invention relates generally to personal tracking devices, and more particularly to a personal tracking device embedded in footwear.

2. Description of the Background Art

Personal tracking devices are known in the art. One possibly desirable means of carrying a personal tracking device is to incorporate the personal tracking device into footwear. However, there are many obstacles to incorporating a personal tracking device into footwear, while maintaining the comfort, appearance, and affordability of the footwear.

One issue that must be addressed is the location of the tracking device. If the tracking device (including the antenna) is located in the sole of the footwear, the satellite location determination signals are shielded from the unit by the wearers foot, and so a relatively sensitive antenna is required. As the sensitivity requirement increases, so generally does the size and cost of the antenna. Additional amplifiers may also be required, which further increases the cost as well as the power consumption of the unit.

Positioning the tracking device in the footwear upper can also be problematic. For example, due to the size of known tracking devices some portion of the upper would need to be significantly expanded in order to accommodate the tracking device. Such an expansion of the upper would almost certainly be noticeable and likely be unacceptable from an appearance standpoint. In addition, the upper typically conforms closely with the foot of the wearer. Therefore, any device of significant size incorporated in the upper might be felt by the wearer, adversely affecting the comfort of the footwear.

Another problem that must be addressed is that the circuitry of the tracking device must be protected from moisture, contamination, and damage, particularly where the footwear is designed for active children and/or outdoor activities such as hunting, wilderness hiking, jogging, and so on. If water gets into the tracking device, the electronic circuitry will short and become nonfunctional. If the tracking device is positioned in the sole of the footwear, the device must be capable of withstanding the weight of the wearer, even when running or jumping.

Another potential problem is that the tracking device may become dislodged from the footwear and lost or damaged. The cost of a tracking device is somewhat significant, and frequent loss of devices would likely pose a barrier to consumer acceptance of the product.

Yet another problem is that the tracking device can interfere with the functionality of the footwear. For example, a large, rigid device in the sole could adversely affect the flexibility of the sole. As another example, a device in the tongue of a shoe could interfere with proper lacing of the shoe.

Finally, it could be a disadvantage if the tracking device is visible or obvious from the outward appearance of the footwear. For example, in the case of a kidnapping it would be a disadvantage if the kidnapper recognized that the victim had footwear with a tracking device. Then, the kidnapper could frustrate the tracking effort simply by discarding the footwear.

In view of the above-described problems, what is needed is a means for incorporating a tracking device in footwear that does not adversely affect the functionality, the appearance, and/or the comfort of the footwear. What is also needed is a means for incorporating a tracking device in footwear that facilitates the use of relatively inexpensive and/or less sensitive antennas. What is also needed is a means for incorporating a tracking device in footwear that protects the tracking device from moisture, contamination, and physical damage. What is also needed is a means for incorporating a tracking device in footwear that prevents dislodgment and loss of the tracking device. What is also needed is a means for incorporating a tracking device in footwear such that the presence of the tracking device is not apparent from the outward appearance of the footwear.

SUMMARY

One aspect of the present invention overcomes some or all the above-described problems associated with the prior art by providing footwear with a tracking device disposed in a cavity formed in the upper surface of the sole of the footwear. Another aspect of the present invention overcomes some or all of the above-described problems associated with the prior art by providing footwear with a tracking device disposed in the sole of the footwear and an antenna servicing the tracking device disposed in/on the upper of the footwear.

The footwear includes a sole, a location determining device, and a wireless communication device. The location determining device and the wireless communication device are electronically coupled to one another and are disposed in a cavity formed in the top surface of the sole. In a particular embodiment, the location determining device determines the position of the footwear using signals transmitted by a positioning system (e.g., a satellite or terrestrial based global positioning system). Alternatively, the location determining device obtains information indicative of the position of the footwear exclusively via the wireless communication device.

In the example embodiment, the wireless communication device and the location determining device are encapsulated in a waterproof material (e.g., a polyamide resin). The encapsulating waterproof material defines a slot to facilitate the insertion of a memory device (e.g., a Subscriber Identification Module or SIM card) to uniquely identify the wireless communication device. The slot is sealed (e.g., by adhesive, removable plug, etc.) after the memory device is inserted.

The encapsulating material also defines a slot for receiving a battery. The wireless communication device is mounted on a circuit board that has a battery connector mounted thereon. The encapsulating material encapsulates a first portion of the battery connector that is connected to the circuit board and leaves a second portion on the connector exposed to facilitate connection to the battery. The battery receiving slot guides the battery into engagement with the battery connector. Optionally, the battery slot can be sealed once the battery is inserted therein.

Optionally, the footwear further includes a charging connector electrically coupled to charge the battery via, for example, a charging circuit on the circuit board. The charging connector is mounted in an opening in a side of the sole of the footwear. The charging connector is coupled to the battery/charging circuit via a flexible circuit substrate (e.g., polyimide sheet with conductive circuit traces formed thereon).

The footwear further includes an upper fixed to the sole and having an inner layer and an outer layer. A communication antenna electrically coupled to the wireless communication device is disposed on a flexible circuit substrate between the inner layer and the outer layer of the upper. In the example embodiment described, the communication antenna is disposed in the heel portion of the upper.

Optionally, a location signal antenna is electrically coupled to the location determining device via a flexible circuit substrate and is disposed in the upper. In the example embodiment described, the location signal antenna is a directional antenna disposed in the heel portion of the upper. The heel portion defines a support structure for maintaining the directional antenna in an upwardly directed position.

As indicated above, either the communication antenna or the location signal antenna or both, are fixed to the upper. A flexible circuit substrate electrically couples the antennas to the wireless communication device and the location determining device, respectively. The flexible circuit substrate includes at least one connector for detaching at least a portion of the flexible circuit substrate from the wireless communication device and/or the location determining device. In the embodiment shown, the flexible circuit substrate includes a first portion coupled to at least one the wireless communication device and the location determining device, a second portion coupled to at least one of the communication antenna and the and the location signal antenna, and a connector for coupling the first and second portions of the flexible circuit substrate.

A method for manufacturing footwear is also disclosed. The method includes the steps of providing a sole, providing an upper, fixing the upper to the sole, incorporating a tracking device in the sole, incorporating an antenna in the upper and connecting the antenna to the tracking device. In a particular method, the step of incorporating the antenna in the upper occurs prior to fixing the upper to the sole, and the step of incorporating the tracking device in the sole occurs after the step of fixing the upper to the sole. The antenna is incorporated in a heel portion of the upper. The particular method further includes encapsulating the tracking device in a waterproof material. The step of connecting the antenna to the tracking device includes connecting the antenna to the tracking device via a flexible circuit substrate.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing footwear with an embedded tracking device. In the following description, numerous specific details are set forth (e.g., particular electronic components) in order to provide a thorough understanding of the invention. Those skilled in the art will recognize, however, that the invention may be practiced apart from these specific details. In other instances, details of well known footwear manufacturing and electronics assembly practices and components have been omitted, so as not to unnecessarily obscure the present invention.

Figure 1:
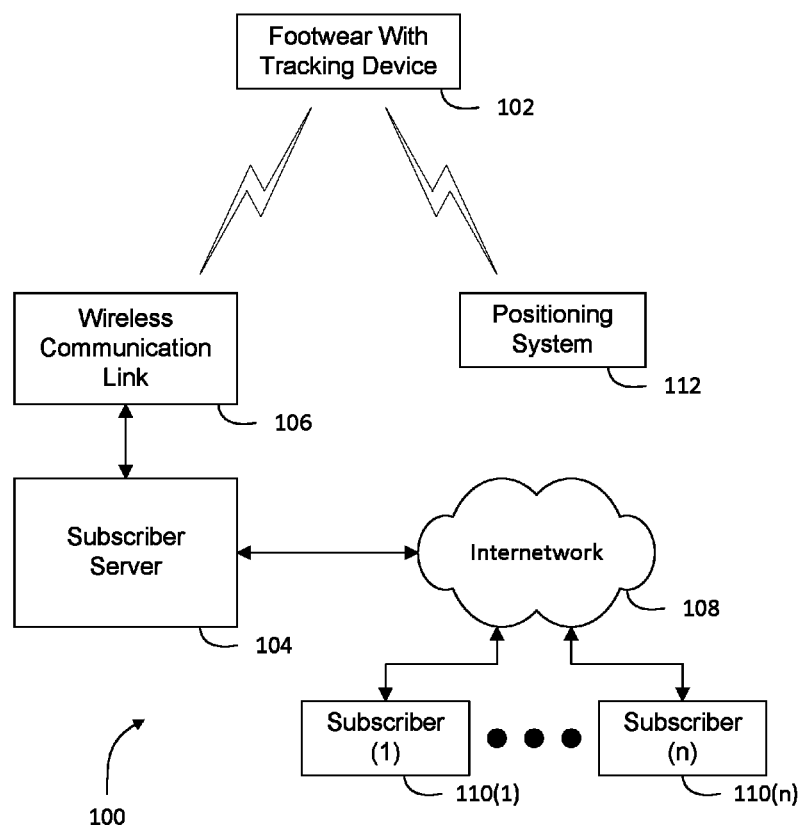
FIG. 1 is a block diagram of a tracking system.

FIG. 1 is a block diagram of a tracking system 100 including the footwear 102 of the present invention. Tracking system 100 further includes a subscriber server 104, a wireless communication link 106, an internetwork 108, one or more subscribers 110(1-n), and a positioning system 112.

Footwear 102 includes a tracking device that communicates wirelessly with subscriber server 104 via wireless communication link 106. In the particular embodiment described, wireless communications link 106 is a mobile telephone network. However, the invention is not limited to use with any particular type of mobile telephone network. Indeed, wireless communication link 106 represents any means of wireless communication, now known or yet to be discovered, that facilitates communication between footwear 102 and subscriber server 104 including, but not limited to cellular networks (e.g., CDMA and GSM), satellite networks, WIFI networks, and radio communication.

Subscriber server 104 receives data from footwear 102 indicative of the geographic position of footwear 102, and provides the information to subscribers 110(1-n) via internetwork 108. In this particular embodiment of the invention, internetwork 108 is the Internet. However, any suitable means of communication between subscriber server 104 and subscriber servers 110(1-n) can be used for internetwork 108.

Subscribers 110(1-n) represent individuals with an interest in the location of the person wearing footwear 102. For example tracking system 100 can be used by parents to locate children, by service departments to locate emergency service personal in the field, and so on. Subscribers 110(1-n) communicate with subscriber server 104 via internetwork 108 using some sort of client device including, but not limited to, a personal computers, a telephone, and so on.

Responsive to a command from subscriber server 104, footwear 102 determines its location using location signals received from positioning system 112 and transmits data indicative of the determined system back to subscriber server 104. Positioning system 112 represents any type of satellite or terrestrial based positioning system that transmits signals that can be used to determine location. For example, a global positioning system (GPS) currently in use employs a plurality of satellites that continuously transmit signals. GPS receivers can calculate location by determining the difference in the time of receipt of signals from different satellites. GPS technology is well known, and so will not be described in detail herein.

As an alternative to a GPS type system, positioning system 112 can be incorporated into wireless communication link 106. For example, wireless telephone networks now have the capability of determining the location of mobile telephone handsets based on signals from a plurality of signal towers in the network. Wireless communication link 106 can then provide the determined location directly to footwear 102, which in turn can communicate the location to subscriber server 104. As a result, positioning system 112 can be thought of as either optional or as being incorporated into wireless communication link 106.

Figure 2:
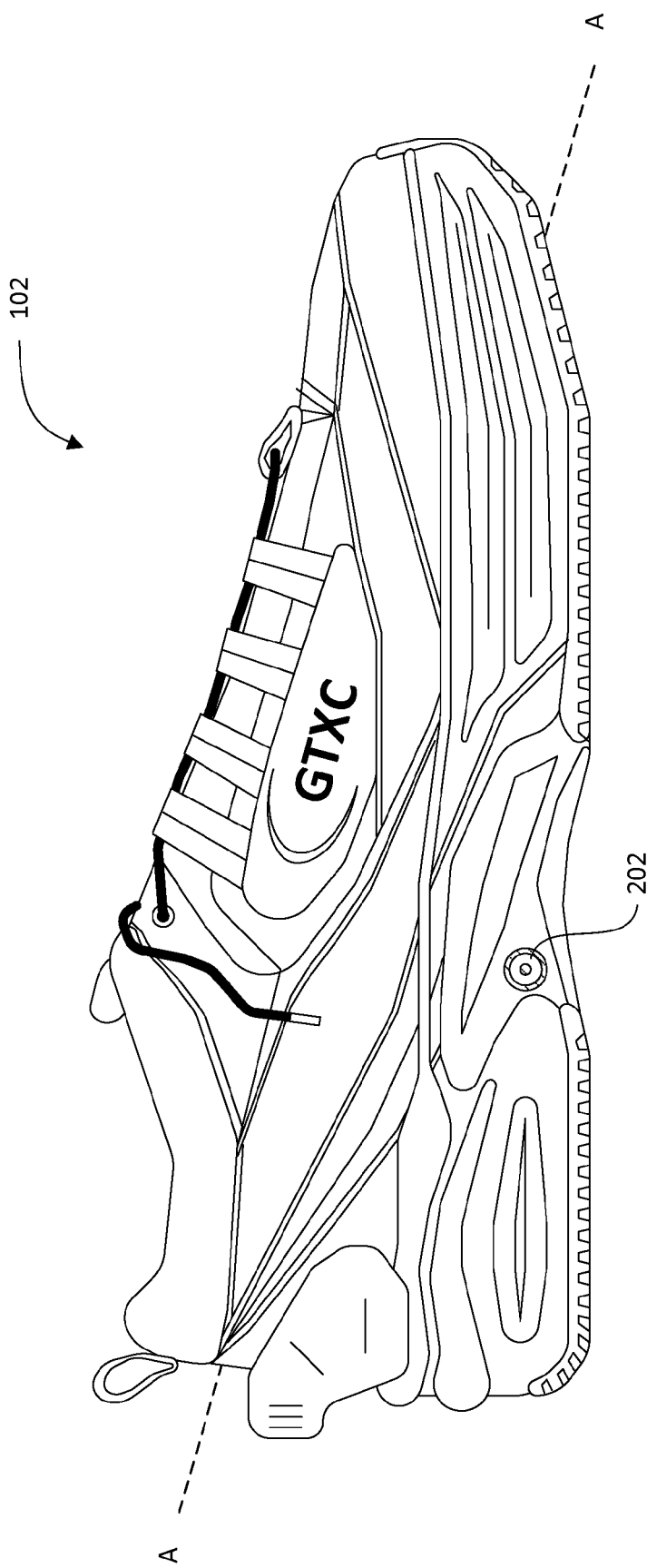
FIG. 2 is a side view of footwear with an embedded tracking device for use with the tracking system of FIG. 1.

FIG. 2 is a side view of footwear 102. A charging connector 202 is disposed in the medial side of the sole to facilitate electrical charging of the tracking device. Apart from charging connector 202, the tracking device is not visible in the view of FIG. 2. The concealment of the tracking device provides an advantage in that a kidnapper would not be alerted to the fact that he/she might be being tracked. Charging connector 202 can be further concealed by inserting a plug (not shown) into connector 202, which also protects against dirt and water entering connector 202. Indeed, if complete concealment is desired, charging connector 202 can easily be relocated to an inner portion of footwear 102.

Figure 3:
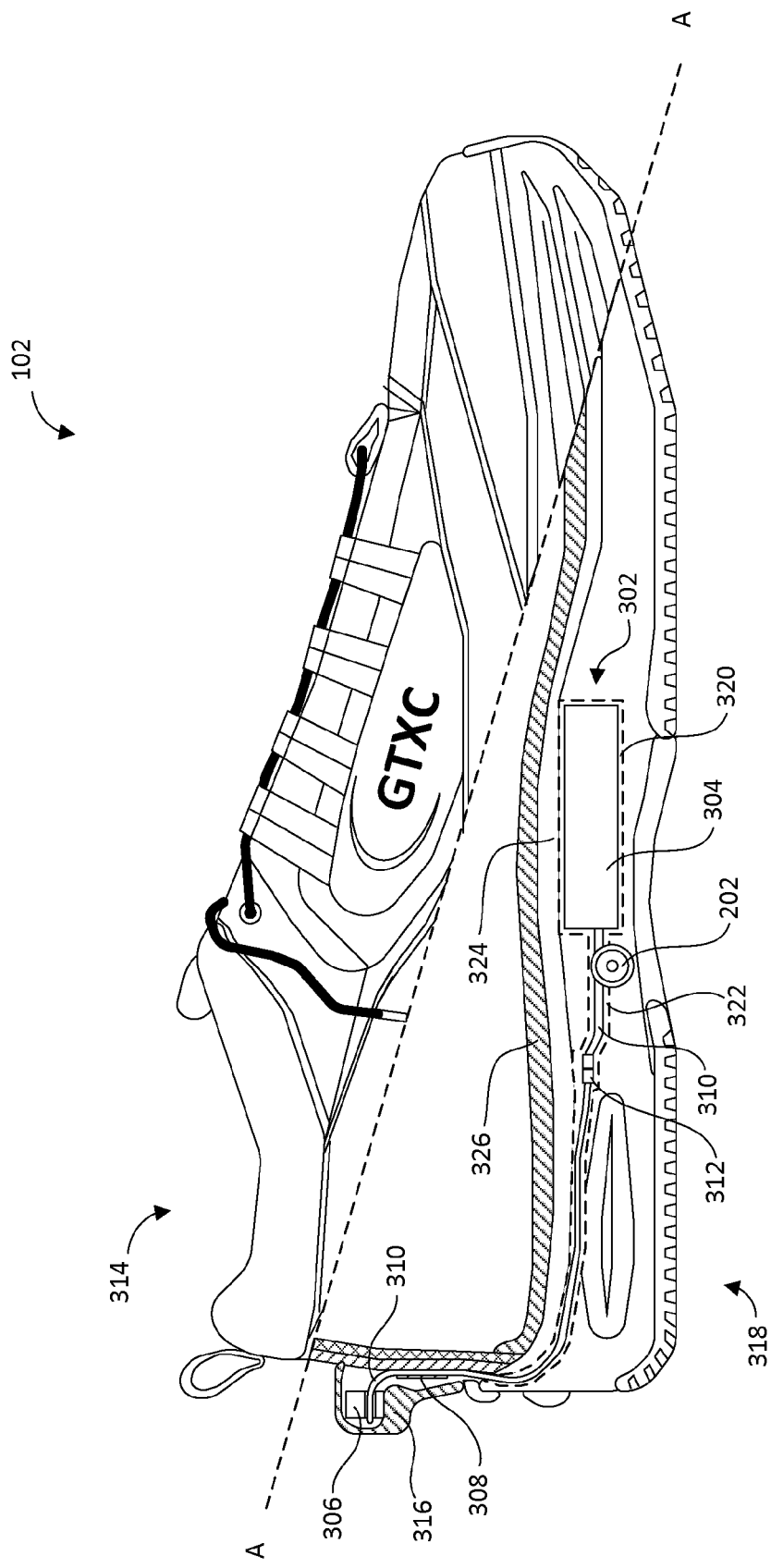
FIG. 3 is a partially cut-away side view of the footwear of FIG. 2.

FIG. 3, is a partially cut away side view of footwear 102, revealing the tracking device 302 concealed therein. Tracking device 302 includes an electronics module 304, a location signal antenna 306 (GPS in this embodiment), a wireless communication antenna 308 (GSM in this embodiment), and charging connector 202, all electrically connected via a flexible circuit substrate 310. Flexible circuit substrate 310 is divided into two portions, which are connected to one another via a connector 312.

GPS antenna 306 and GSM antenna 308 are both disposed in the heel portion of the upper 314 of footwear 102. GPS antenna 306 is a passive, directional antenna that is mounted directly on flexible circuit substrate 310 and is supported in an upwardly facing position by a support structure 316 formed by the component layers of upper 314. In this position, GPS satellite signals are not blocked by the foot of the wearer. GSM antenna 308 is formed on a trace layer of flexible circuit substrate 310 facing away from the heel of the wearer. Both GPS antenna 306 and GSM antenna 308 are protected between inner and outer layers of upper 314.

Electronics module 304 and charging connector 202 are both disposed in the sole 318 of footwear 102. In particular, electronics module 304 is disposed in a cavity 320 formed in a top surface of sole 318. Flexible circuit substrate lies in a channel 322 formed in the top surface of sole 318. Channel 322 extends from cavity 320 toward the heel of sole 318, where flexible circuit substrate 310 transitions between sole 318 and upper 314, entering between inner and outer layers of upper 314. Cavity 320 and channel 322 are accessible through an opening in the insole 324, such that electronics module can be removed and/or replaced. During wear, the opening through insole 324 is folded closed and/or covered by a sock liner 326.

Separating antennas 306 and 308 from electronics module 304 by placing the former in upper 314 and the latter in sole 318 provides advantages over the prior art. For example, antennas 306 and 308 can be selected and positioned to get the best reception from the least expensive type of antenna, without worrying about accommodating the bulk of electronics module 304 in the upper. Similarly, electronics module 304 can be placed in the sole, where it is protected and unobtrusive, without concern about blocking the GPS signals.

Figure 4:
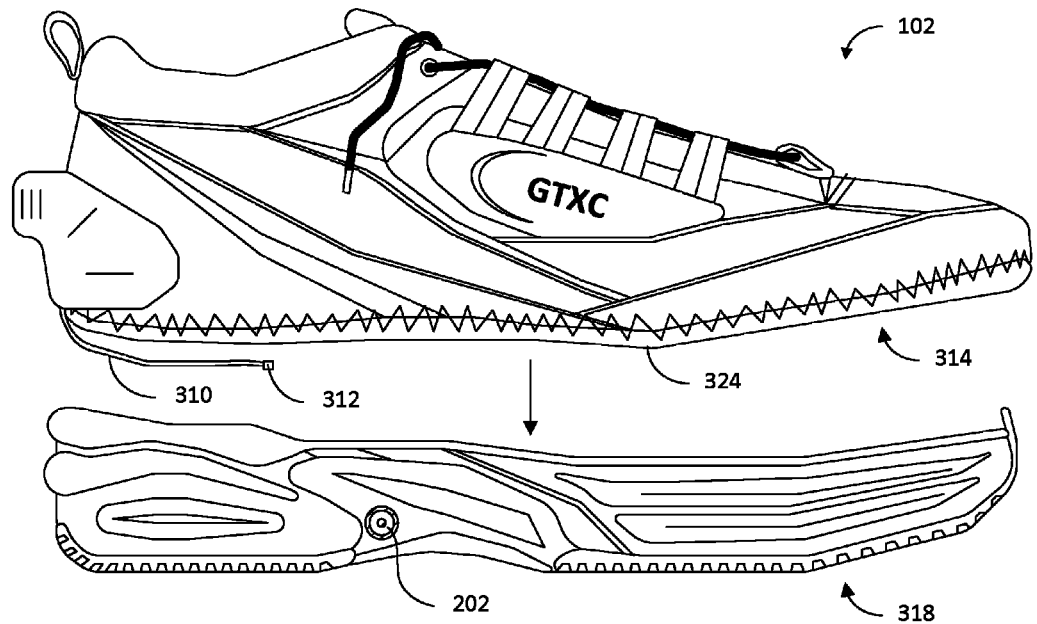
FIG. 4 is a side view of a detached upper and sole of the footwear of FIG. 2.

FIG. 4 is a side view of upper 314 and sole 318 detached from one another. During the manufacturing process, upper 314 and sole 318 are assembled separately, as shown, and then bonded together to form footwear 102. During the bonding process an adhesive is applied to the bottom surface of insole 324 and to the top surface of sole 318, taking care not to fill channel 322 (FIG. 3) with adhesive. Next, the portion of flexible circuit substrate 310 extending from the heel of upper 314 is temporarily secured so that it will remain in or above channel 322 during the bonding process. The upper and the sole are then passed through a high temperature oven to activate the bonding agent. Finally, upper 314 and sole 318 are pressed together in a pressing operation.

The electronic components of footwear 102 are protected from the high temperatures and pressures of the bonding process. Structure 316 provides suitable protection for antennas 306 and 308. In addition, because electronics module 304 is removable, it can be inserted after the bonding process and, therefore, not be exposed to the bonding process at all.

Figure 5:
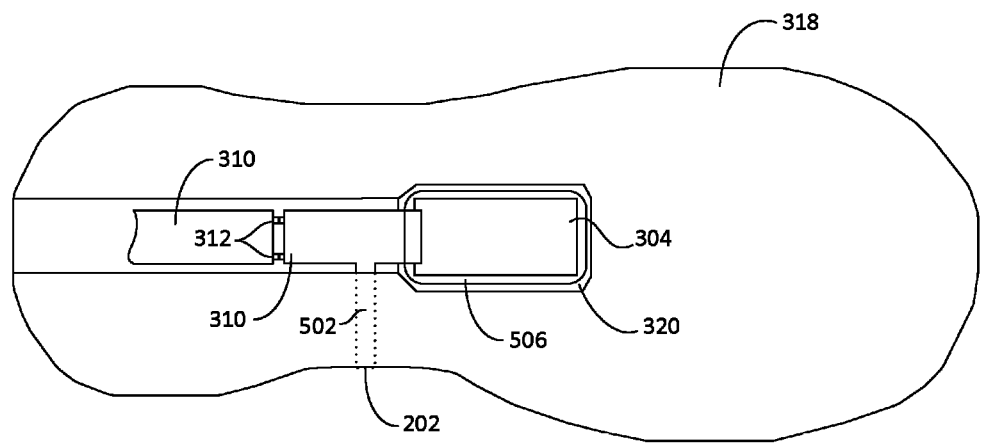
FIG. 5 is a top view of the sole of the footwear of FIG. 2.

FIG. 5 is a top view of sole 318 showing how electronics module 304 is inserted in cavity 320. Charging connector 202 is pushed into a tunnel 502 far enough to be accessible from the outside of sole 318. Connectors 312 are engaged, thereby coupling the separate sections of flexible circuit substrate 310. Note that only a portion of the section coupled to antennas 306 and 308 is shown. Electronics module 304 is then pressed into cavity 320. These steps need not occur in any particular order.

Electronics module 304 is encapsulated in a solid, waterproof material to protect it from water and or shock. In particular, electronics module 304 is encapsulated in a polyamide resin material via a low pressure molding process. One satisfactory material for the encapsulation is a product sold under the trade name MACROMELT®.

Figure 6:
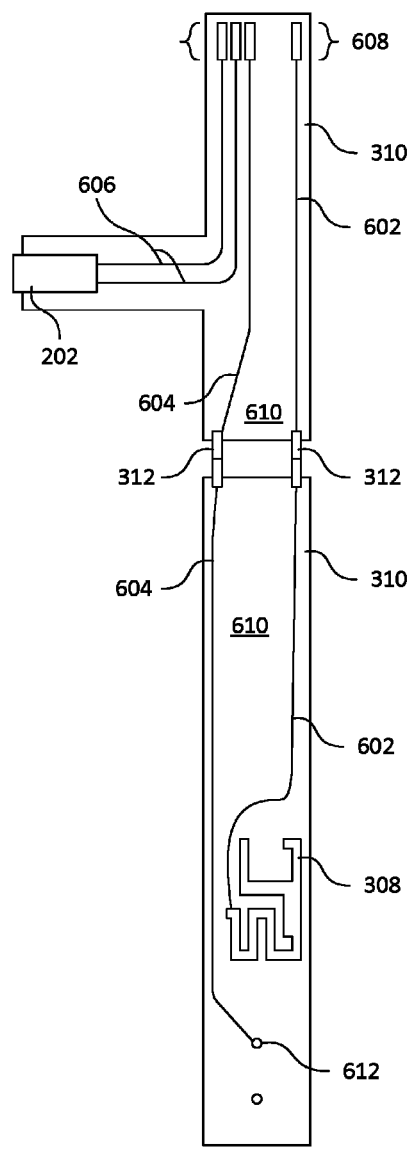
FIG. 6 is a top view of a flexible connector of the upper of FIG. 4.

FIG. 6 is a bottom view (from the perspective of FIG. 3) of two-piece flexible circuit substrate 310. Flexible circuit substrate 310 includes a communication antenna trace 602, a location signal antenna trace 604, two charge connector traces 606, and a plurality of contacts 608, each coupled to a respective one of traces 602, 604, and 606, all formed on an insulating, flexible substrate 610. In this particular embodiment, traces 602, 604, and 606 are 50 ohm impedance matched copper traces. Each of copper traces 602 and 604 are coupled across the gap between the separate sections of flexible circuit substrate 310 by one of connectors 312, which are MMCX RF connectors.

Trace 602 and the associated one of connectors 312 electrically couple one of contacts 608 with GSM antenna 308. Trace 604 and the associated one of connectors 312 electrically couple another of contacts 608 to GPS antenna 306 (FIG. 7) through a via hole. Traces 606 couple the remaining two of contacts 608 to charging connector 202. Contacts 608 are connected to a corresponding set of contacts on a circuit board of electronics module 304 prior to the above-described encapsulation process. Thus, GPS antenna 306, GSM antenna 308, and charging connector 202 are all electrically coupled to the circuitry of electronics module 304 via flexible circuit substrate 310.

Flexible substrate 610 is formed of a polyimide sheet. In addition, flexible circuit substrate includes adhesive layers (not shown) between the polyimide sheet and the traces to maintain adhesion of the traces onto polyimide sheet 610. Further, flexible circuit substrate includes a protective layer (not shown) over the trace layer to protect and insulate traces 602, 604, and 606. These additional layers are not shown so as not to unnecessarily obscure the drawing.

Figure 7:
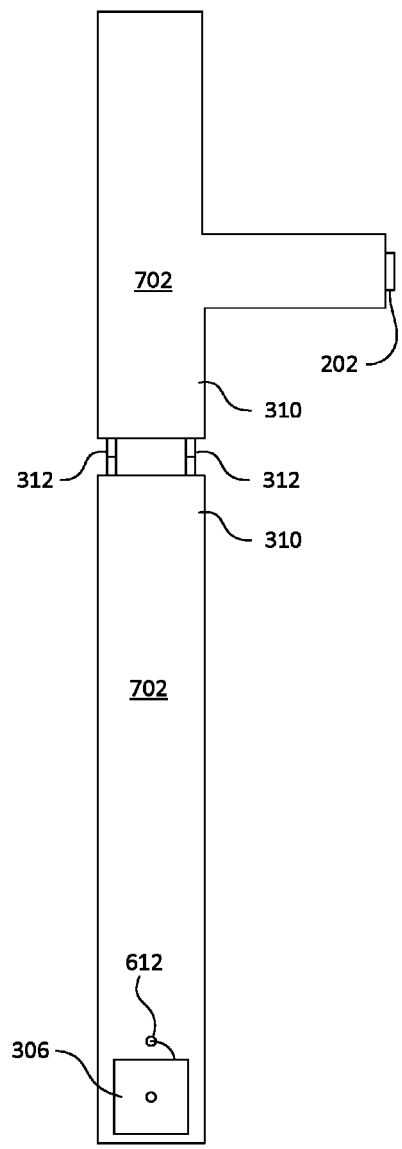
FIG. 7 is a bottom view of the flexible connector of the upper of FIG. 4.

FIG. 7 is a top view of flexible circuit substrate 310. Substantially the entire top surface 702 of flexible circuit substrate 702 is covered by a copper ground plane. GPS antenna 306 is mounted on the ground plane of surface 702 and is connected to signal trace 604 through via 612. An adhesive layer (not shown) is disposed between copper ground plane 702 and flexible substrate 610, and a protective layer (not shown) is provided over ground plane 702.

It should be understood that the particular materials and components (as well as other described elements, even if not explicitly stated) are not essential elements of the present invention. For example, the present invention may be practiced with an alternate flexible connectors, materials, and so on. Further, in particular embodiments of the invention, certain of these elements may be omitted altogether. Indeed, no single aspect of the invention is considered to be an essential element of the invention.

Figure 8:
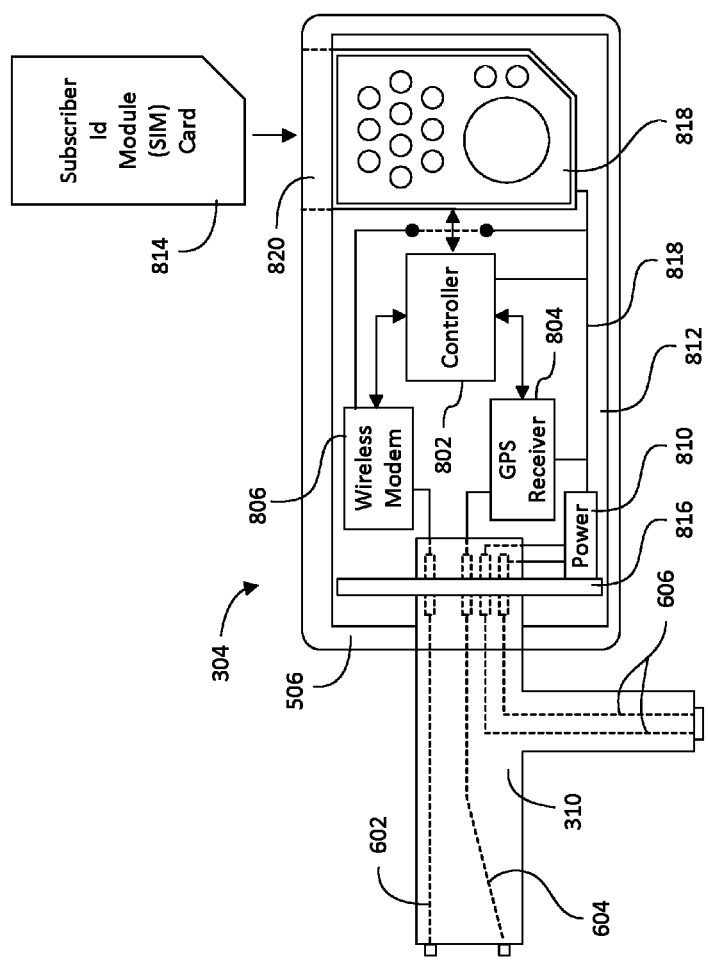
FIG. 8 is a representational drawing of a tracking device of the footwear of FIG. 3.

FIG. 8 is a representational diagram of electronics module 304, which is shown to include a controller 802, a GPS receiver 804, a wireless modem 806, a SIM card socket 808, and a power supply 810, all mounted on a circuit board 812. Controller 802 includes a processing unit and code, which when executed provides overall coordination and control of the various functions described herein. GPS receiver 804 is electrically coupled to trace 604, which connects GPS receiver 804 to GPS antenna 306 (FIG. 3). GPS receiver 804 processes location signals received via GPS antenna 306 and provides the current location of footwear 102 to controller 802. Wireless modem 806 is electrically coupled to trace 602, which connects wireless modem 806 to GSM antenna 308 (FIG. 3). Wireless modem 806 is able to establish a connection with subscriber server 104 via wireless communication link 106, as described above with reference to FIG. 1. SIM card socket 808 is designed to receive a subscriber identification module 814, which includes data that uniquely identifies the card (e.g., a phone number) and facilitates access to wireless communication link 106 (e.g., a wireless telephone network).

Power supply 810 is coupled to charging connector 202 via traces 606, and is coupled to a battery 902 (FIG. 9) via a battery connector 816, which is also mounted on circuit board 812. When charging connector 202 is connected to an external charger, power supply 810 charges battery 902. In addition, during normal operation of electronics module 304, power supply 810 draws power from battery 902 and provides power to each component of electronics module 304 at whatever voltages are required by the particular components via voltage supply lines 818. Although voltage supply lines 818 are shown as a single line, it should be understood that voltage supply lines 818 will include as many lines as necessary to satisfy the voltage/power requirements of the particular components.

The encapsulation material 506 encapsulates circuit board 812 and all of the components mounted thereon, forming a water tight seal around flexible circuit substrate 310. With two exceptions, encapsulation material 506 completely encapsulates electronics module 304. The first exception is a slot 820 that facilitates removal and reinsertion of the SIM card during initial activation. Once module 304 is activated, slot 820 is sealed with an epoxy, a plug, or any other water tight means (not shown). The second exception to complete encapsulation of module 304 is that a portion of battery connector 816 is left unencapsulated to facilitate the insertion and removal of battery 902, as will be described with reference to FIG. 9.

Figure 9:
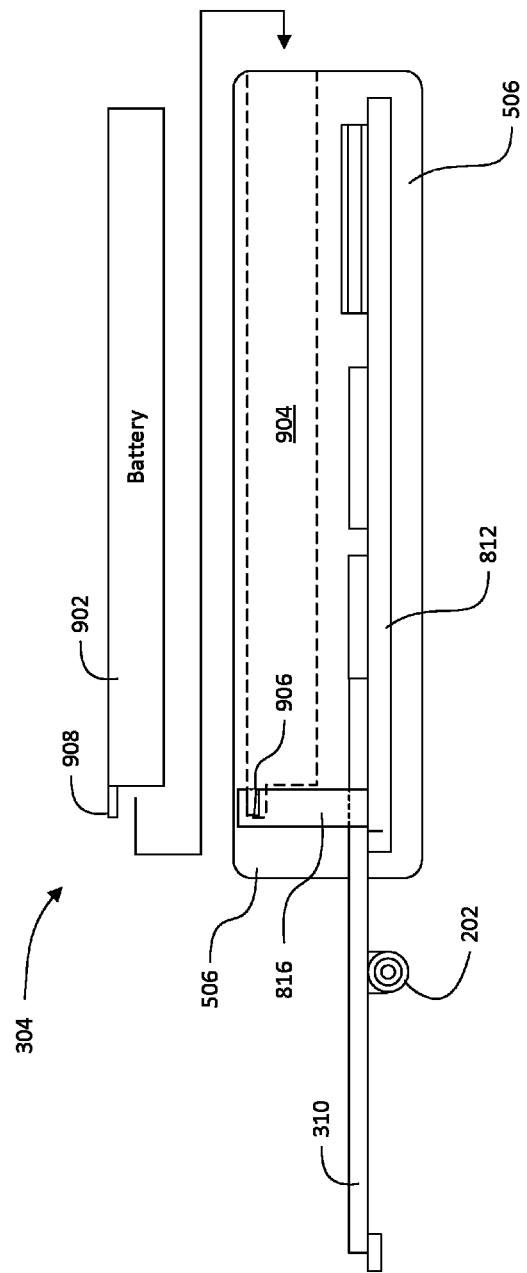
FIG. 9 is a side view of the tracking device encapsulated in a waterproof material.

FIG. 9 is a side view of electronics module 304 that shows a slot 904 defined by encapsulation material 506 for receiving battery 902. Battery connector 816 extends up from circuit board 812 and into slot 904. The majority of battery connector 816 is encapsulated by encapsulation material 506, but a portion of battery connector 816 is left exposed in slot 904. The exposed portion of battery connector 816 includes a plurality (only one is visible in FIG. 9) of electrical contact slots 906 configured to receive a like plurality (only one visible) of electrical terminals 908 extending from battery 902. When battery 902 is inserted into slot 904 as shown by the directional arrow in FIG. 9, terminals 908 engage contact slots 906, thereby energizing electronics module 304. After insertion of battery 902, the open end of slot 904 is sealed with a removable, watertight plug or cap.

Figure 10:
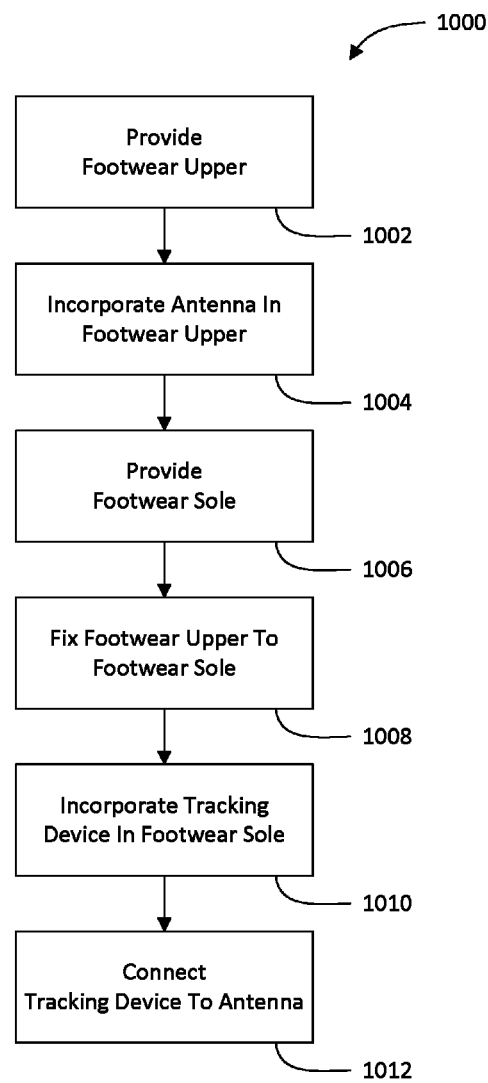
FIG. 10 is a flow chart summarizing one method for manufacturing footwear with an embedded tracking device.

FIG. 10 is a flowchart summarizing one method 1000 for manufacturing footwear with an embedded tracking device. In a first step 1002, a footwear upper is provided. Then, in a second step 1004, an antenna is incorporated into the footwear upper. Next, in a third step 1006, a footwear sole is provided. Then, in a forth step 1008, the footwear upper is fixed to the footwear sole. Then, in a fifth step 1010, a tracking device is incorporated into the footwear sole. Finally, in a sixth step 1012, the tracking device is connected to the antenna.

It should be noted that the steps of method 1000 need not occur in the exact order shown. For example, it is possible to connect the tracking device to the antenna before completely incorporating the tracking device into the footwear sole. As another example, it is possible to connect the tracking device to the antenna and/or incorporate the tracking device into the footwear sole prior to fixing the upper to the sole.

The description of particular embodiments of the present invention is now complete. Many of the described features may be substituted, altered or omitted without departing from the scope of the invention. For example, if the wireless communication device (e.g., controller 802 and wireless modem 806) can obtain position information from the particular wireless communication link 106 used, then the GPS components (receiver 804 and antenna 306 can be omitted. As another example, individual wires may be substituted for flexible circuit substrate 310. As yet another example, GPS antenna 306 can be disposed on the toe of the footwear and connected to module 304 by a flexible circuit substrate wrapping around the toe of the footwear. These and other deviations from the particular embodiments shown will be apparent to those skilled in the art, particularly in view of the foregoing disclosure.

We claim:

1. Footwear comprising:
    a sole;
    an upper having an interior surface at least partially defining a foot receiving space of said footwear, said upper being coupled to said sole;
    a location determining device;
    a wireless communication device electronically coupled to said location determining device;
    a communication antenna fixed to said footwear outside said foot receiving space;
    a first electrical conductor extending between said upper and said sole, said wireless communication device being coupled to said communication antenna via said first electrical conductor;
    a location signal antenna fixed to said footwear outside said foot receiving space; and
    a second electrical conductor extending between said upper and said sole, said location determining device being electronically coupled to said location signal antenna via said second electrical conductor.

2. Footwear according to claim 1, wherein at least on of said first electrical conductor and said second electrical conductor are embodied in a flexible circuit substrate.

3. Footwear according to claim 2, wherein said flexible circuit substrate includes:
    a top surface facing said upper;
    a bottom surface facing said sole;
    a first portion coupled to at least one of said communication antenna and said location signal antenna; and a second portion coupled to at least one of said location determining device and said wireless communication device.

4. Footwear according to claim 1, wherein said upper and said sole are bonded together via a thermoset adhesive, said first electrical conductor being resistant to temperatures above the curing temperature of said thermoset adhesive.

5. A method for manufacturing footwear, said method comprising:
- providing an upper;
- providing a sole;
- providing a location determining device;
- providing a wireless communication device electronically coupled to said location determining device;
- providing a communication antenna coupled to a first electrical conductor;
- fixing said communication antenna to said footwear;
- providing a location signal antenna including a second electrical conductor;
- fixing said location signal antenna to said footwear;
- positioning at least one of said first electrical conductor and said second electrical conductor to pass between said upper and said sole; and
- fixing said upper and said sole together after said step of positioning said at least one of said first electrical conductor and said second electrical conductor between said upper and said sole.

6. The method of claim 5, wherein at least on of said first electrical conductor and said second electrical conductor are embodied in a flexible circuit substrate.

7. The method of claim 6, wherein said flexible circuit substrate includes:
- a top surface facing said upper;
- a bottom surface facing said sole;
- a first portion coupled to at least one of said communication antenna and said location signal antenna; and
- a second portion coupled to at least one of said location determining device and said wireless communication device.

8. The method of claim 5, wherein said step of fixing said upper and said sole together includes bonding said upper and said sole together via a thermoset adhesive, said first electrical conductor being resistant to temperatures above the curing temperature of said thermoset adhesive.

9. The method of claim 5, further comprising
- electrically coupling said wireless communication device to said first conductor after said step of fixing said upper and said sole together, and
- electrically coupling said location determining device to said second conductor after said step of fixing said upper and said sole together.

* * * * *